United States Patent [19]

Breimesser et al.

[11] Patent Number: 4,906,886

[45] Date of Patent: Mar. 6, 1990

[54] ULTRASOUND SENSOR

[75] Inventors: Fritz Breimesser, Nuremberg; Bernd Granz, Oberasbach; Bertram Sachs, Erlangen, all of Fed. Rep. of Germany

[73] Assignee: Siemens Aktiengesellschaft, Munich, Fed. Rep. of Germany

[21] Appl. No.: 320,566

[22] Filed: Mar. 8, 1989

[30] Foreign Application Priority Data

Mar. 10, 1988 [DE] Fed. Rep. of Germany ....... 3808019

[51] Int. Cl.[4] ............................................ H01L 41/08

[52] U.S. Cl. .................................... 310/334; 310/337; 310/349; 310/800; 310/329

[58] Field of Search ............................... 310/334–337, 310/322, 324, 329, 349, 350, 800

[56] References Cited

U.S. PATENT DOCUMENTS 4,803,671 2/1989 Rochling et al. .................. 310/800

*Primary Examiner*—Mark O. Budd

*Attorney, Agent, or Firm*—Kenyon & Kenyon

[57] ABSTRACT

An ultrasound sensor is used for measuring the sound pressure amplitude in the focal range of focused ultrasound shock waves. The sensor contains a polymer foil which is piezoelectrically activated in one region and is coupled to electrodes which are physically separated from the region. The polymer foil is arranged in a hollow plastic cylinder with its flat surface sides parallel to the central longitudinal axis of the hollow cylinder. By this measure, interfering diffraction effects are reduced and miniaturization of the ultrasound sensor is achieved.

12 Claims, 1 Drawing Sheet

ULTRASOUND SENSOR

FIELD OF THE INVENTION

The present invention relates to ultrasound sensors and, more particularly, to an ultrasound sensor using a polymer foil having a piezoelectrically activated region.

BACKGROUND OF THE INVENTION

Membrane or miniature hydrophone probes are used to determine the properties of an ultrasonic field prevailing in a sound-carrying medium such as water. The three-dimensional distribution of the ultrasonic field is sound pressure amplitude from the ultrasonic field is determined by measuring the prevailing sound pressure in a measuring tray at different locations using a hydrophone probe.

In "Ultrasonics," May 1980, pages 123–126, a membrane hydrophone is disclosed. The membrane hydrophone uses a foil of polyvinylidene fluoride PVDF having a thickness of 25 μm. The PVDF foil is stretched between two metal rings serving as support bodies to form a diaphragm having an inside diameter of about 100 mm. Each surface of the membrane includes a small central region having oppositely disposed circular disk-like electrodes. The diameter of the disk-like electrodes are, for example, 4 mm. A polarized, piezoelectrically induced active region is between these electrodes. Metal film leads are applied to the diaphragm surfaces to carry the signals from the circular disk-like active region of the diaphragm to the diaphragm rim. The metal film leads are coupled at the diaphragm rim to a coaxial cable by means of a conductive adhesive.

It is not possible, however, to measure with the prior hydrophones, ultrasonic shock waves having pressure amplitudes in the range of $10^8$ Pa. Such shock waves have very steep pulse flanks. The rise times of the steep pulse flanks are less than 1 usec which leads to mechanical destruction of the hydrophones. The mechanical destruction is caused by the cavitation effects of the metallic electrodes that are applied to the PVDF layer. These high pressure amplitude shock waves occur, for example, in the focal range of lithotripterns in which a focused ultrasonic shock wave is used for destroying concrements such as kidney stones in a patient's kidney. During the development and routine monitoring of hydrophone equipment, it is necessary to determine the properties of the shock wave in the focal range.

European Pat. No. A2-0 227 985 discloses an ultrasound sensor having a polymer foil fastened at its rim to a support body. The polymer film is piezoelectrically activated in a subzone and is electrically coupled to an electrode. The electrode must be arranged physically apart from the piezoelectrically active region. Ultrasonic waves in the piezoelectrically active region of the polymer foil cause surface charge vibrations. These vibrations are electrically coupled via the sound-carrying medium surrounding the polymer foil to the electrodes arranged outside the surface region of the polymer foil related to the piezoelectrically active region. Because no mechanically astable electrically conductive layer is present in the central region of the polymer foil, the piezoelectrically active region can thus be arranged within the focal range of a focused ultrasonic shock wave.

Through the use of a piezoelectric polymer having a small dielectric constant relative to piezoceramic materials, purely capacitive coupling is possible without great signal losses. Accordingly, the electrodes can be physically arranged separate from the piezoelectrically active regions of the polymer foil on the foil itself, as well as outside the foil i.e., at the foil support body.

In this prior device, the piezoelectric polymer foil is tautly clamped between two annular support bodies. The flat surfaces of the polymer foil are oriented perpendicular to the central axis of the support bodies. The ultrasound to be measured has a direction of incidence substantially parallel to the central axis. In order to avoid any interfering diffraction effects on the ultrasound sensor occurring at the inner edge facing away from the center of the polymer foil, the diameter of the polymer foil must be very large. In the prior ultrasound sensor, therefore, miniaturization is always accompanied by a degradation of the receiving properties.

SUMMARY OF THE INVENTION

The present invention overcomes the problems of the prior ultrasound sensors by providing an ultrasound sensor having reception properties which, for practical purposes, are not influenced by diffraction effects. Further, the present invention provides an ultrasound sensor which is mechanically stable and easy to handle.

The ultrasound sensor includes a polymer foil having its planar surfaces disposed parallel to the central axis of a hollow plastic cylinder. Because the polymer foil is arranged with its flat surfaces parallel to the central axis of the hollow cylinder, it provides measurements of the ultrasound waves which propogate perpendicularly to this central axis. Therefore, the length of the hollow cylinder has no substantial influence on the ultrasonic field prevailing at the location of the polymer foil. Improved handling and mechanical stability for the ultrasound sensor are thus achieved by the present invention. If the diameter of the hollow cylinder is small, an accordingly long design further improves the handling and mechanical stability.

DETAILED DESCRIPTION

Figure 1:
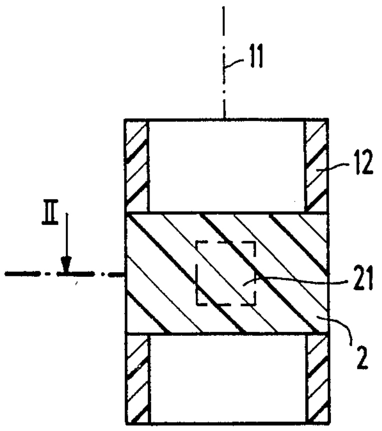
FIG. 1 is a longitudinal section view of an ultrasound sensor according to the present invention.

Referring to FIG. 1, a piezoelectric polymer foil 2 is arranged in a hollow cylinder 12 serving as a support device. The polymer foil 2 has its flat surfaces parallel to the central axis 11 of the hollow cylinder 12. In a preferred embodiment, the piezoelectric polymer foil 2 is made of polyvinylidene fluoride (PVDF) and is piezoelectrically activated in only a small central region 21. This piezoelectrically active region 21 can form, for example, a circular disc, polarized in the direction of its thickness and having a diameter "d" smaller than 2 mm.

In particular, the diameter d is smaller than 1 mm. The thickness of the piezoelectrically active region 21 is between 10 μm and 100 μm corresponding to the thickness of the polymer foil 2. The thickness of the cylinder wall is approximately 0.5 mm, thus making the outside diameter of the hollow cylinder 12 approximately 10 mm to 20 mm. In a preferred embodiment, the length of the hollow cylinder 12 is about 100 mm.

Figure 2:
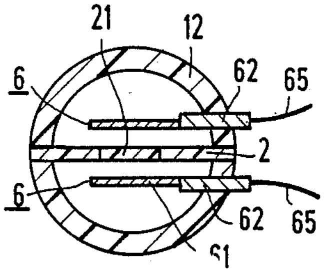
FIG. 2 is a cross-sectional view of the ultrasound sensor of FIG. 1.

Referring to FIG. 2, a plane electrode 6 is shown in relationship to the flat surfaces of the piezoelectrically active region 21 which extends parallel to the flat surfaces. The electrodes 6 are each fastened by means of a mounting 62 in the wall of the hollow cylinder 12 and are provided with a connecting conductor 65. When a shock wave pulse arrives at the active region 21, alternating charges are generated at the surface of the active region 21. The alternating charge signal is capacitively coupled to the two electrodes 6 by the soundcarrying medium located between the electrodes 6 and the active region 21, e.g., water or oil.

Figure 3:
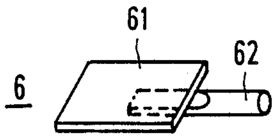
FIG. 3 illustrates an electrode for the capacitive pickup of the measuring signal used in the present invention.

The part of the electrodes 6 which receive the signals can be, for example, a plane metal foil 61 which is fastened to a mounting 62 as shown in FIG. 3. In a preferred embodiment, the metal foil 61 is an steel alloy having a thickness of approximately 20 μm. Alternatively, instead of a metal foil 61, a fine metal grid can be used to receive the signals. Optionally, to reduce parasitic capacitance, the mounting 62 of the electrodes 6 can advantageously be shifted 180° relative to each other.

Figure 4:
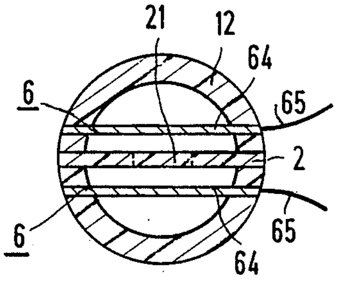
FIG. 4 is a cross-sectional view of an embodiment of the electrodes in an ultrasound sensor according to the invention.

Referring to FIG. 4, another embodiment has the electrodes 64 cemented into corresponding recesses of the hollow cylinder 12 with their opposite lateral edges extending parallel to the central axis 11.

Figure 5:
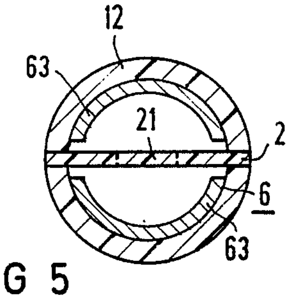
FIG. 5 is a cross-sectional view of a further embodiment of the electrodes in an ultrasound sensor according to the invention.

FIG. 5 shows a further embodiment wherein the electrodes 6 have the shape of a portion of the cylinder surface. The electrodes 6 are arranged as a metallic layer 63, on the inside surface of the hollow cylinder 12.

Figure 6:
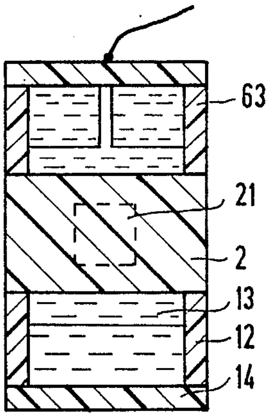
FIG. 6 is a longitudinal section view of an embodiment of the ultrasound sensor of the present invention.

Referring to FIG. 6, there is shown a particularly advantageous embodiment wherein the hollow cylinder 12 is closed tightly by cover plates 12 arranged at each end face of the cylinder 12. The interior of the hollow cylinder 12 is filled with a sound-carrying liquid 13, e.g., high-purity water having a conductivity less than 10 μS/cm or silicone oil. In a further preferred embodiment, the hollow cylinder 12 is made of polymethylpentene (PMP). Because the acoustic impedance of polymethylpentene PMP closely matches the acoustic impedance of water, the impedance steps occurring at the hollow cylinder 12 play practically no part in the ultrasonic field prevalent at the measurement point. Therefore, the impedance steps lead only to a negligible falsification of the ultrasonic field at the measurement point. Because the same sound-carrying liquid 13 is always located in the interior of the hollow cylinder 12, a reproducible capacitive coupling between the piezoelectrically active region 21 and the electrodes 6 is assured. An ultrasound sensor with these features is therefore particularly suitable for the absolute measurement of ultrasonic fields having a large pressure amplitude.

What is claimed is:

1. An ultrasound sensor, comprising:

(a) a hollow plastic cylinder having a central longitudinal axis;

(b) a polymer foil having opposite flat surface sides and a piezoelectrically activated subregion, said polymer foil being fastened in a freely supported manner to said hollow cylinder with said opposite flat surface sides parallel to the central longitudinal axis; and (c) a plurality of electrodes physically separated from said piezoelectrically activated subregion of the polymer film and electrically coupled to said subregion.

2. A sensor according to claim 1 wherein the polymer foil is made of polyvinylidene fluoride (PVDF).

3. A sensor according to claim 1 wherein said plurality of electrodes further comprise a planar metallic foil associated with each of said electrodes, one of said electrodes being positioned on each side of the opposite flat surface of the polymer film.

4. A sensor according to claim 1 wherein said plurality of electrodes further comprise metallic layers positioned on the inner wall of the hollow cylinder.

5. A sensor according to claim 1 wherein the hollow cylinder is made of polymethtypentene (PMP).

6. A sensor according to claim 1 further comprising:

(a) a first end plate coupled to one end of the hollow cylinder;

(b) a second end plate coupled to the other end of the hollow cylinder, said first and second end plates closing off said hollow cylinder; and (c) a sound carrying liquid filling said hollow cylinder.

7. A sensor according to claim 2 wherein said plurality of electrodes further comprise a planar metallic foil associated with each of said electrodes, one of said electrodes being positioned on each side of the opposite flat surface of the polymer film.

8. A sensor according to claim 7 wherein the hollow cylinder is made of polymethtypentene (PMP).

9. A sensor according to claim 8 further comprising:

(a) a first end plate coupled to one end of the hollow cylinder;

(b) a second end plate coupled to the other end of the hollow cylinder, said first and second end plates closing off said hollow cylinder; and (c) a sound carrying liquid filling said hollow cylinder.

10. A sensor according to claim 2 wherein said plurality of electrodes further comprise metallic layers positioned on the inner wall of the hollow cylinder.

11. A sensor according to claim 10 wherein the hollow cylinder is made of polymethtypentene (PMP).

12. A sensor according to claim 11 further comprising:

(a) a first end plate coupled to one end of the hollow cylinder;

(b) a second end plate coupled to the other end of the hollow cylinder, said first and second end plates closing off said hollow cylinder; and (c) a sound carrying liquid filling said hollow cylinder.

* * * * *